(12) United States Patent
Cai

(10) Patent No.: US 11,056,552 B2
(45) Date of Patent: Jul. 6, 2021

(54) DISPLAY PANEL AND METHOD OF MANUFACTURING SAME

(71) Applicant: Shenzhen China Star Optoelectronics Semiconductor Display Technology Co., Ltd., Guangdong (CN)

(72) Inventor: Zhenfei Cai, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 16/621,239

(22) PCT Filed: Nov. 14, 2019

(86) PCT No.: PCT/CN2019/118484
§ 371 (c)(1),
(2) Date: Dec. 11, 2019

(87) PCT Pub. No.: WO2021/027160
PCT Pub. Date: Feb. 18, 2021

(65) Prior Publication Data
US 2021/0050400 A1 Feb. 18, 2021

(30) Foreign Application Priority Data
Aug. 13, 2019 (CN) .......................... 201910742348.0

(51) Int. Cl.
*H01L 29/08* (2006.01)
*H01L 27/32* (2006.01)
(Continued)

(52) U.S. Cl.
CPC ...... *H01L 27/3265* (2013.01); *H01L 27/3248* (2013.01); *H01L 27/3258* (2013.01); *H01L 27/3262* (2013.01); *H01L 29/7869* (2013.01); *H01L 51/5206* (2013.01); *H01L 51/5221* (2013.01); *H01L 51/56* (2013.01);
(Continued)

(58) Field of Classification Search
CPC ............. H01L 51/5221; H01L 51/5206; H01L 27/3265; H01L 27/3262; H01L 27/3248
See application file for complete search history.

(56) References Cited

U.S. PATENT DOCUMENTS 9,935,163 B2 * 4/2018 Han .................... H01L 27/3262
2013/0092943 A1 * 4/2013 Hatano ............... H01L 27/1225
257/57

(Continued)

FOREIGN PATENT DOCUMENTS

| CN | 108735792 A | 11/2018 |
| CN | 109920923 A | 6/2019 |
| JP | 2005227562 A | 8/2005 |

*Primary Examiner* — Phuc T Dang
(74) *Attorney, Agent, or Firm* — Mark M. Friedman

(57) ABSTRACT

A display panel and a method of manufacturing of the same are provided. The display panel includes a storage capacitor and a light emitting structure. The light emitting structure is disposed above the storage capacitor, and a light emitting surface of the light emitting structure faces the storage capacitor. A first plate of the storage capacitor includes an anode and an active area electrically connected with each other, and a second plate of the storage capacitor includes a source/drain electrode layer, and the source/drain electrode layer is a transparent electrode.

13 Claims, 2 Drawing Sheets

(51) Int. Cl.
    *H01L 51/52*     (2006.01)
    *H01L 29/786*     (2006.01)
    *H01L 51/56*     (2006.01)
    *H01L 27/12*     (2006.01)

(52) U.S. Cl.
    CPC ...... *H01L 27/1225* (2013.01); *H01L 27/1248* (2013.01); *H01L 27/1255* (2013.01); *H01L 27/1259* (2013.01); *H01L 2227/323* (2013.01)

(56) References Cited

U.S. PATENT DOCUMENTS

| | | | | |
|---|---|---|---|---|
| 2014/0332800 | A1* | 11/2014 | Hanaoka | H01L 27/124 257/43 |
| 2015/0001474 | A1* | 1/2015 | Park | H01L 51/5271 257/40 |
| 2017/0098686 | A1* | 4/2017 | Jeong | H01L 27/3276 |
| 2018/0358421 | A1* | 12/2018 | Gai | H01L 27/1288 |

* cited by examiner

DISPLAY PANEL AND METHOD OF MANUFACTURING SAME

FIELD OF INVENTION

The present disclosure relates to the field of electronic display technologies, and more particularly to a display panel and a method of manufacturing the same.

BACKGROUND OF INVENTION

Organic light emitting diode (OLED) display panels have high contrast ratio, wide viewing angle, and fast response speed, and are expected to replace liquid crystal display panels as s mainstream choice for next-generation displays.

At present, large-size OLED display panels adopt a 3T1C driving circuit, and its aperture ratio is approximately between 20% and 30%. In a conventional bottom emitting display panel, light emitted from an organic layer needs to be emitted through each film layer of a driving circuit. Since metal in a capacitor area is opaque, light cannot penetrate. Therefore, an open area of a 3T1C pixel driving circuit and the storage capacitor are usually designed separately, as shown in FIG. 1, thereby reducing an aperture ratio of a pixel. In addition, since pixel patterns in pixel points are concentrated in a small space, it is easy to cause short circuit, open circuit, and other electrical defects, which reduces the product yield.

SUMMARY OF INVENTION

An embodiment of the present invention provides a display panel and a method of manufacturing the same, which can improve an aperture ratio of a bottom emitting organic light emitting diode (OLED) display panel.

In order to solve the above issues, an embodiment of the present application provides a display panel. The display panel comprises a storage capacitor and a light emitting structure. The light emitting structure is disposed above the storage capacitor, and a light emitting surface of the light emitting structure faces the storage capacitor. A first plate of the storage capacitor comprises an anode and an active area electrically connected with each other, a second plate of the storage capacitor comprises a source/drain electrode layer, and the source/drain electrode layer is a transparent electrode.

In an embodiment of the present application, the light emitting structure comprises the anode, a light emitting material, and a cathode; the anode is a transparent electrode; the light emitting material is disposed between the anode and the cathode; and the cathode is a reflective electrode.

In an embodiment of the present application, the transparent electrode is a combination of one or more of indium tin oxide, aluminum-doped zinc oxide, and fluorine-doped tin oxide.

In an embodiment of the present application, the reflective electrode is a combination of one or more of silver, aluminum, copper, and gold.

In an embodiment of the present application, the active area is an indium gallium zinc oxide film.

In an embodiment of the present application, the display panel further comprises a substrate; a buffer layer disposed on the substrate; the active area disposed on the buffer layer, wherein the active area comprises a channel area and a source/drain area disposed on both sides of the channel area; a gate stack disposed above the active area and covering the channel area; an interlayer dielectric layer covering the active area and the gate stack; the source/drain electrode layer disposed above the interlayer dielectric layer and electrically connected to the source/drain area through a first via hole penetrating through the interlayer dielectric layer; a planarization layer covering the source/drain electrode layer; the anode disposed on the planarization layer and electrically connected to the source/drain electrode layer through a second via hole; and a light emitting structure disposed on the anode.

In an embodiment of the present application, an area of the source/drain electrode layer is greater than or equal to twice an area of the active area, and a projection of the source/drain electrode layer on the substrate completely covers a projection of the active area and the anode on the substrate.

Accordingly, an embodiment of the present application further provides a method of manufacturing a display panel, comprising steps of: providing a substrate; forming a buffer layer covering the substrate; forming an active area, the active area being disposed on the buffer layer, the active area comprising a channel area and a source/drain area disposed on both sides of the channel area; forming a gate stack above the active area covering the channel area; forming an interlayer dielectric layer covering the active area and the gate stack; forming a source/drain electrode layer above the interlayer dielectric layer, wherein the source/drain electrode layer is a transparent electrode, and the source/drain electrode layer constitutes a second plate of a storage capacitor of the display surface; forming a planarization layer, the planarization layer covering the source/drain electrode layer; forming an anode, wherein the anode is disposed on the planarization layer, the anode is electrically connected to the active area and constitutes a first plate of the storage capacitor of the display surface; and forming a light emitting structure, the light emitting structure being disposed on the anode.

In an embodiment of the present application, the method of forming the light emitting structure comprises steps of: forming the anode, wherein the anode is disposed on the planarization layer and the anode is a transparent electrode; forming a light emitting material, the light emitting material being disposed on the anode; and forming a cathode, wherein the cathode covers the light emitting material, and the cathode is a reflective electrode.

In an embodiment of the present application, the transparent electrode is a combination of one or more of indium tin oxide, aluminum-doped zinc oxide, and fluorine-doped tin oxide.

In an embodiment of the present application, the reflective electrode is a combination of one or more of silver, aluminum, copper, and gold.

In an embodiment of the present application, the active area is an indium gallium zinc oxide film.

In an embodiment of the present application, an area of the source/drain electrode layer is greater than or equal to twice an area of the active area, and a projection of the source/drain electrode layer on the substrate completely covers a projection of the active area and the anode on the substrate.

Beneficial effects of the present application are that: a display panel provided by an embodiment of the present application uses a transparent electrode to form a source/drain electrode layer in a bottom emitting OLED display panel. Since the light emitted by the light emitting structure can penetrate the source/drain electrode layer, the storage capacitor in the embodiment of the present application can be disposed directly under the light emitting structure without setting the light emitting structure in a metal avoidance area of the thin film transistor. The embodiment of the present application not only effectively increases an aperture ratio of a 3T1C pixel driving circuit, but also effectively increases a layout area of the thin film transistor, avoids occurrence of short circuit, open circuit and other electrical defects, and improves the product yield.

DESCRIPTION OF DRAWINGS

In order to more clearly illustrate the technical solutions in the embodiments of the present application, the drawings used in the description of the embodiments will be briefly described below. It is obvious that the drawings in the following description are only some embodiments of the present application. Other drawings can also be obtained from those skilled in the art based on these drawings without paying any creative effort.

DETAILED DESCRIPTION OF PREFERRED EMBODIMENTS

Figure 1:
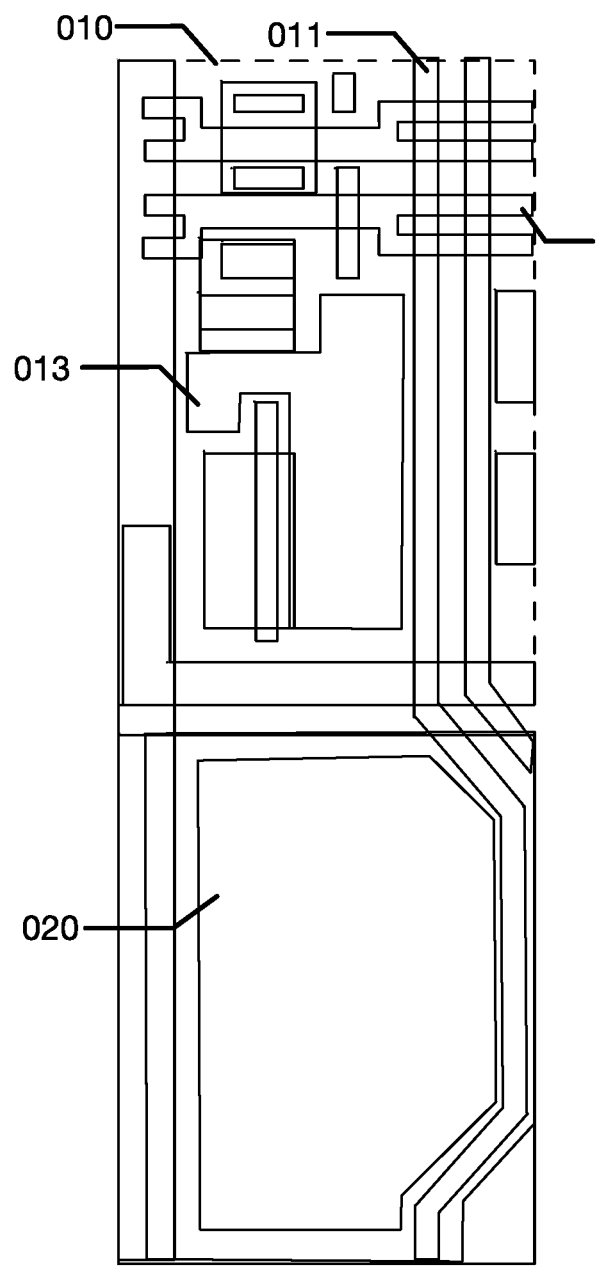
FIG. 1 is a schematic structural view of a driving circuit of an organic light emitting diode (OLED) display panel in the prior art.

The following description of the various embodiments is provided to illustrate the specific embodiments of the present invention. The directional terms mentioned in the present application, such as up, down, front, back, left, right, inside, outside, side, etc., are only directions referring to the additional drawings. Therefore, the directional terminology used is for the purpose of illustration and understanding and is not intended to be limiting. In the figures, structurally similar elements are denoted by the same reference numerals.

Referring to FIG. 1, the prior art is briefly described first. A 3T1C pixel driving circuit in the prior art includes a functional area 010 and a light transmitting area 020. A gate line 012, a data line 011, and a storage capacitor 013 are distributed in different film layers of the functional area 010 and are isolated from each other by an insulating layer.

For a bottom light emitting display panel, since metal of a capacitor area is opaque, light cannot penetrate. Therefore, an open area of a 3T1C pixel driving circuit and the storage capacitor are usually designed separately, thereby reducing an aperture ratio of a pixel. In addition, since pixel patterns in pixel points are concentrated in a small space, it is easy to cause short circuit, open circuit, and other electrical defects, which reduces the product yield.

Therefore, an embodiment of the present invention provides a display panel and a method of manufacturing the same, which can improve an aperture ratio of a bottom emitting organic light emitting diode (OLED) display panel.

Figure 2:
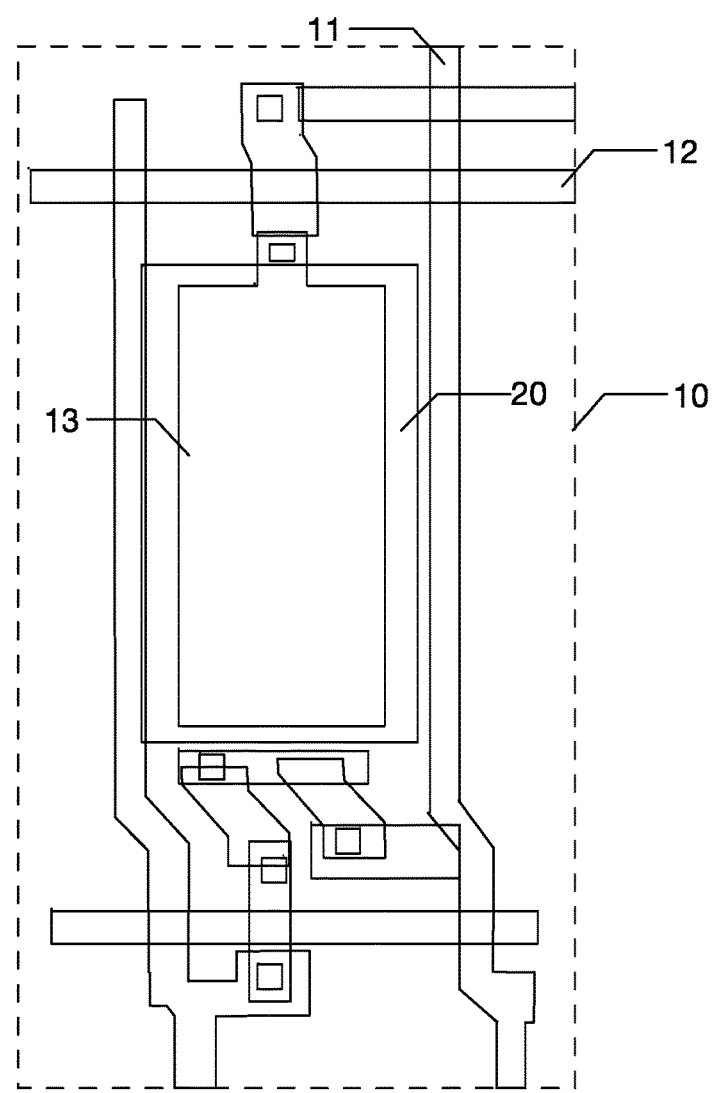
FIG. 2 is a schematic structural view of a driving circuit of an OLED display panel according to an embodiment of the present application.
Figure 3:
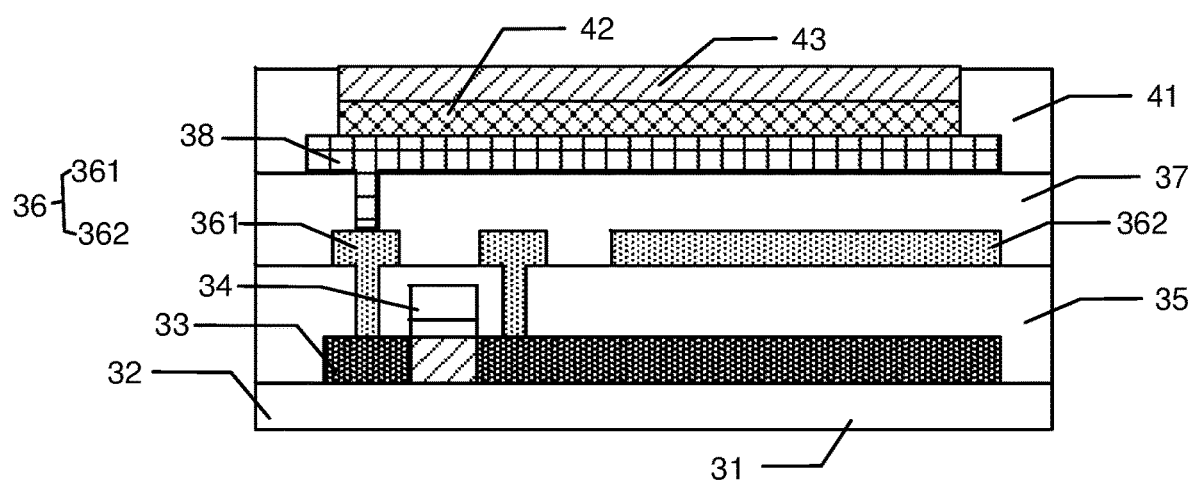
FIG. 3 is a schematic cross-sectional view of a driving circuit of the OLED display panel of FIG. 2.

Referring to FIG. 2 and FIG. 3, FIG. 2 is a schematic structural view of a driving circuit of an OLED display panel according to an embodiment of the present application, and FIG. 3 is a schematic cross-sectional view of a driving circuit of the OLED display panel of FIG. 2.

In an embodiment of the present application, the display panel includes a functional area 10 and a light emitting structure 20. The functional area includes a data line 11, a gate line 12, and a storage capacitor 13. The light emitting structure is disposed above the storage capacitor 13, and a light emitting surface of the light emitting structure 20 faces the storage capacitor 13. A first plate of the storage capacitor 13 includes an anode 38 and an active area 33 electrically connected with each other. A second plate of the storage capacitor 13 includes a source/drain electrode layer 36, and the source/drain electrode layer 36 is a transparent electrode.

Referring to FIG. 3, in an embodiment of the present application, the source/drain electrode layer 36 includes a first portion 361 and a second portion 362 spaced apart from the first portion 361. The first portion 361 and the second portion 362 are isolated by a planarization layer 37. The first portion 361 is for electrically connecting the anode 38 and the active area 33. The second portion 362 is used as a second plate of the storage capacitor 13 to connect an electrical signal different from the first plate.

In an embodiment of the present application, the light emitting structure 20 comprises the anode 38, a light emitting material 42, and a cathode 43. The anode 38 is a transparent electrode. The active area 33 is an indium gallium zinc oxide film. The light emitting material 42 is disposed between the anode 38 and the cathode 43. The cathode 43 is a reflective electrode. The transparent electrode is a combination of one or more of indium tin oxide, aluminum-doped zinc oxide, and fluorine-doped tin oxide. The reflective electrode is a combination of one or more of silver, aluminum, copper, and gold. The use of the transparent electrode to form the source/drain electrode layer in the bottom emitting OLED display panel enables light emitted from the light emitting structure to penetrate the source/drain electrode layer. Therefore, the storage capacitor in the embodiment of the present application may be disposed directly under the light emitting structure without setting the light emitting structure in a metal avoidance area of the thin film transistor.

Referring to FIG. 3, in an embodiment of the present application, the display panel further comprises a substrate 31, a buffer layer 32, a gate stack 34, an interlayer dielectric layer 35, a planarization layer 37, and a light emitting structure 20.

The buffer layer 32 is disposed on the substrate 31. The active area 33 is disposed on the buffer layer 32, and the active area 33 comprises a channel area and a source/drain area disposed on both sides of the channel area. The gate stack 34 is disposed above the active area 33 and covering the channel area. The interlayer dielectric layer 35 covers the active area 33 and the gate stack 34. The source/drain electrode layer 36 is disposed above the interlayer dielectric layer 35 and electrically connected to the source/drain area through a first via hole penetrating through the interlayer dielectric layer 35. The planarization layer 37 covers the source/drain electrode layer 36. The anode 38 is disposed on the planarization layer 37 and electrically connected to the source/drain electrode layer 36 through a second via hole. The light emitting structure 20 is disposed on the anode 38.

Since resistance of the transparent electrode is generally greater than that of silver, aluminum, copper, gold, etc., in order to prevent resistivity of the source/drain electrode layer from being too large to affect operation of the driving circuit, in an embodiment of the present application, an area of the source/drain electrode layer 36 is greater than or equal to twice an area of the active area 33, and a projection of the source/drain electrode layer 36 on the substrate 31 completely covers a projection of the active area 33 and the anode 38 on the substrate 31. This arrangement effectively reduces resistance of the transparent electrode and prevents excessive voltage drop on the source/drain electrode layer from affecting operation of the driving circuit.

Accordingly, an embodiment of the present application further provides a method of manufacturing a display panel, comprising steps of:

Providing a substrate 31.

Forming a buffer layer 32 covering the substrate 31.

Forming an active area 33, the active area 33 being disposed on the buffer layer 32, the active area 33 comprising a channel area and a source/drain area disposed on both sides of the channel area.

Forming a gate stack 34 above the active area 33 covering the channel area.

Forming an interlayer dielectric layer 35 covering the active area 33 and the gate stack 34.

Forming a source/drain electrode layer 36 above the interlayer dielectric layer 35, wherein the source/drain electrode layer 36 is a transparent electrode, and the source/drain electrode layer 36 constitutes a second plate of a storage capacitor 13 of the display surface.

Forming a planarization layer 37, the planarization layer 37 covering the source/drain electrode layer 36.

Forming an anode 38, wherein the anode 38 is disposed on the planarization layer 37, the anode 38 is electrically connected to the active area 33 and constitutes a first plate of the storage capacitor 13 of the display surface.

Forming a light emitting structure 20, the light emitting structure 20 being disposed on the anode 38.

In an embodiment of the present application, the method of forming the light emitting structure 20 comprises steps of:

Forming the anode 38, wherein the anode 38 is disposed on the planarization layer 37 and the anode 38 is a transparent electrode.

Forming a light emitting material 42, the light emitting material 42 being disposed on the anode 38.

Forming a cathode 43, wherein the cathode 43 covers the light emitting material 42, and the cathode 43 is a reflective electrode.

In an embodiment of the present application, the display panel includes a functional area 10 and a light emitting structure 20. The functional area includes a data line 11, a gate line 12, and a storage capacitor 13. The light emitting structure is disposed above the storage capacitor 13, and a light emitting surface of the light emitting structure 20 faces the storage capacitor 13. A first plate of the storage capacitor 13 includes an anode 38 and an active area 33 electrically connected with each other. A second plate of the storage capacitor 13 includes a source/drain electrode layer 36, and the source/drain electrode layer 36 is a transparent electrode.

In an embodiment of the present application, the light emitting structure 20 comprises the anode 38, a light emitting material 42, and a cathode 43. The anode 38 is a transparent electrode. The active area 33 is an indium gallium zinc oxide film. The light emitting material 42 is disposed between the anode 38 and the cathode 43. The cathode 43 is a reflective electrode. The transparent electrode is a combination of one or more of indium tin oxide, aluminum-doped zinc oxide, and fluorine-doped tin oxide. The reflective electrode is a combination of one or more of silver, aluminum, copper, and gold. The use of the transparent electrode to form the source/drain electrode layer in the bottom emitting OLED display panel enables light emitted from the light emitting structure to penetrate the source/drain electrode layer. Therefore, the storage capacitor in the embodiment of the present application may be disposed directly under the light emitting structure without setting the light emitting structure in a metal avoidance area of the thin film transistor.

Since resistance of the transparent electrode is generally greater than that of silver, aluminum, copper, gold, etc., in order to prevent resistivity of the source/drain electrode layer from being too large to affect operation of the driving circuit, in an embodiment of the present application, an area of the source/drain electrode layer 36 is greater than or equal to twice an area of the active area 33, and a projection of the source/drain electrode layer 36 on the substrate 31 completely covers a projection of the active area 33 and the anode 38 on the substrate 31. This arrangement effectively reduces resistance of the transparent electrode and prevents excessive voltage drop on the source/drain electrode layer from affecting operation of the driving circuit.

A display panel provided by an embodiment of the present application uses a transparent electrode to form a source/drain electrode layer 36 in a bottom emitting OLED display panel. Since the light emitted by the light emitting structure 20 can penetrate the source/drain electrode layer 36, the storage capacitor 13 in the embodiment of the present application can be disposed directly under the light emitting structure 20 without setting the light emitting structure 20 in a metal avoidance area of the thin film transistor. The embodiment of the present application not only effectively increases an aperture ratio of a 3T1C pixel driving circuit, but also effectively increases a layout area of the thin film transistor, avoids occurrence of short circuit, open circuit and other electrical defects, and improves the product yield.

In summary, although the present application has been disclosed above in the preferred embodiments, the above preferred embodiments are not intended to limit the present application. Various modifications and refinements can be made by those skilled in the art without departing from the spirit and scope of the present application. The protection scope of the present application is therefore defined by the scope of the claims.

What is claimed is:

1. A display panel, comprising:
a substrate;
a storage capacitor, wherein the storage capacitor is disposed above the substrate; and
a light emitting structure;
wherein the light emitting structure is disposed above the storage capacitor, and a light emitting surface of the light emitting structure faces the storage capacitor; and
wherein a first plate of the storage capacitor comprises an anode, and the anode is electrically connected to an active area, a second plate of the storage capacitor comprises a source/drain electrode layer, and the source/drain electrode layer is a transparent electrode;
wherein a projection of the transparent electrode of the second plate of the storage capacitor on the substrate covers a projection of the light emitting structure on the substrate, and light emitted by the light emitting structure is configured to penetrate the transparent electrode of the second plate of the storage capacitor.

2. The display panel according to claim 1, wherein the light emitting structure comprises the anode, a light emitting material, and a cathode; the anode is a transparent electrode; the light emitting material is disposed between the anode and the cathode; and the cathode is a reflective electrode.

3. The display panel according to claim 2, wherein the transparent electrode is a combination of one or more of indium tin oxide, aluminum-doped zinc oxide, and fluorine-doped tin oxide.

4. The display panel according to claim 2, wherein the reflective electrode is a combination of one or more of silver, aluminum, copper, and gold.

5. The display panel according to claim 1, wherein the active area is an indium gallium zinc oxide film.

6. The display panel according to claim 5, further comprising:
   a buffer layer disposed on the substrate;
   the active area disposed on the buffer layer, wherein the active area comprises a channel area and a source/drain area disposed on both sides of the channel area;
   a gate stack disposed above the active area and covering the channel area;
   an interlayer dielectric layer covering the active area and the gate stack;
   the source/drain electrode layer disposed above the interlayer dielectric layer and electrically connected to the source/drain area through a first via hole penetrating through the interlayer dielectric layer;
   a planarization layer covering the source/drain electrode layer;
   the anode disposed on the planarization layer and electrically connected to the source/drain electrode layer through a second via hole; and
   a light emitting structure disposed on the anode.

7. The display panel according to claim 6, wherein an area of the source/drain electrode layer is greater than or equal to twice an area of the active area, and a projection of the source/drain electrode layer on the substrate completely covers a projection of the active area and the anode on the substrate.

8. A method of manufacturing a display panel, comprising steps of:
   providing a substrate;
   forming a buffer layer covering the substrate;
   forming an active area, the active area being disposed on the buffer layer, the active area comprising a channel area and a source/drain area disposed on both sides of the channel area;
   forming a gate stack above the active area covering the channel area;
   forming an interlayer dielectric layer covering the active area and the gate stack;
   forming a source/drain electrode layer above the interlayer dielectric layer, wherein the source/drain electrode layer is a transparent electrode, and the source/drain electrode layer constitutes a second plate of a storage capacitor of the display panel;
   forming a planarization layer, the planarization layer covering the source/drain electrode layer;
   forming an anode, wherein the anode is disposed on the planarization layer, the anode is electrically connected to the active area and constitutes a first plate of the storage capacitor of the display panel; and
   forming a light emitting structure, the light emitting structure being disposed on the anode;
   wherein a projection of the transparent electrode of the second plate of the storage capacitor on the substrate covers a projection of the light emitting structure on the substrate, and light emitted by the light emitting structure is configured to penetrate the transparent electrode of the second plate of the storage capacitor.

9. The method of manufacturing the display panel according to claim 8, wherein the method of forming the light emitting structure comprises steps of:
   forming the anode, wherein the anode is disposed on the planarization layer and the anode is a transparent electrode;
   forming a light emitting material, the light emitting material being disposed on the anode; and
   forming a cathode, wherein the cathode covers the light emitting material, and the cathode is a reflective electrode.

10. The method of manufacturing the display panel according to claim 9, wherein the transparent electrode is a combination of one or more of indium tin oxide, aluminum-doped zinc oxide, and fluorine-doped tin oxide.

11. The method of manufacturing the display panel according to claim 9, wherein the reflective electrode is a combination of one or more of silver, aluminum, copper, and gold.

12. The method of manufacturing the display panel according to claim 9, wherein the active area is an indium gallium zinc oxide film.

13. The method of manufacturing the display panel according to claim 9, wherein an area of the source/drain electrode layer is greater than or equal to twice an area of the active area, and a projection of the source/drain electrode layer on the substrate completely covers a projection of the active area and the anode on the substrate.

* * * * *